(12) United States Patent
Quaglietta et al.

(10) Patent No.: US 9,768,157 B2
(45) Date of Patent: *Sep. 19, 2017

(54) AMPLIFIER VOLTAGE LIMITING IN RADIO-FREQUENCY DEVICES

(71) Applicant: SKYWORKS SOLUTIONS, INC., Woburn, MA (US)

(72) Inventors: Anthony Francis Quaglietta, Methuen, MA (US); Michael Joseph McPartlin, North Andover, MA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/158,559

(22) Filed: May 18, 2016

(65) Prior Publication Data

US 2016/0268246 A1 Sep. 15, 2016

Related U.S. Application Data

(62) Division of application No. 14/581,668, filed on Dec. 23, 2014, now Pat. No. 9,373,613.

(60) Provisional application No. 61/922,618, filed on Dec. 31, 2013.

(51) Int. Cl.
| | |
|---|---|
| *H01L 29/732* | (2006.01) |
| *H01L 27/02* | (2006.01) |
| *H01L 23/48* | (2006.01) |
| *H01L 21/768* | (2006.01) |
| *H01L 29/66* | (2006.01) |
| *H01L 29/735* | (2006.01) |

(52) U.S. Cl.
CPC .... *H01L 27/0248* (2013.01); *H01L 21/76898* (2013.01); *H01L 23/481* (2013.01); *H01L 29/66272* (2013.01); *H01L 29/732* (2013.01); *H01L 29/735* (2013.01); *H01L 29/7322* (2013.01); *H01L 27/0288* (2013.01); *H01L 2224/05554* (2013.01); *H01L 2224/48091* (2013.01); *H01L 2224/48227* (2013.01); *H01L 2924/15184* (2013.01); *H01L 2924/15192* (2013.01); *H01L 2924/181* (2013.01)

(58) Field of Classification Search
CPC . H01L 27/04; H01L 27/0629; H01L 27/0288; H01L 23/481; H01L 29/732; H01L 29/7322; H01L 29/735
See application file for complete search history.

(56) References Cited

U.S. PATENT DOCUMENTS

| | | | |
|---|---|---|---|
| 8,492,272 B2* | 7/2013 | Adkisson | H01L 21/26586 257/774 |
| 2007/0187717 A1* | 8/2007 | Sadaka | H01L 29/1029 257/192 |
| 2012/0161286 A1* | 6/2012 | Bhalla | H01L 27/0647 257/577 |
| 2014/0001567 A1 | 1/2014 | McPartlin | |

(Continued)

*Primary Examiner* — Nathan W Ha
(74) *Attorney, Agent, or Firm* — Chang & Hale LLP

(57) ABSTRACT

Disclosed herein are systems and method for voltage clamping in semiconductor circuits using through-silicon via (TSV) positioning. A semiconductor die is disclosed that includes a silicon substrate, a bipolar transistor having collector, emitter, base and sub-collector regions disposed on the substrate, and a through-silicon via (TSV) positioned within 35 μm of the sub-collector region in order to clamp a peak voltage of the bipolar transistor at a voltage limit level.

11 Claims, 10 Drawing Sheets

(56) References Cited

U.S. PATENT DOCUMENTS

| | | |
|---|---|---|
| 2014/0001602 A1 | 1/2014 | McPartlin |
| 2014/0001608 A1 | 1/2014 | McPartlin |
| 2014/0002187 A1 | 1/2014 | McPartlin et al. |
| 2014/0003000 A1 | 1/2014 | McPartlin |
| 2014/0054743 A1* | 2/2014 | Hurwitz .............. H01L 29/0642 257/508 |
| 2014/0065821 A1* | 3/2014 | Kawa ................ H01L 21/76898 438/667 |
| 2014/0162449 A1* | 6/2014 | An .................... H01L 21/76885 438/613 |
| 2015/0340429 A1 | 11/2015 | McPartlin et al. |

* cited by examiner

000

AMPLIFIER VOLTAGE LIMITING IN RADIO-FREQUENCY DEVICES

RELATED APPLICATION

This application is a divisional of U.S. patent application Ser. No. 14/581,668, filed on Dec. 23, 2014, entitled AMPLIFIER VOLTAGE LIMITING USING PUNCH-THROUGH EFFECT, which claims priority to U.S. Provisional Application No. 61/922,618, filed on Dec. 31, 2013, entitled AMPLIFIER VOLTAGE LIMITING USING PUNCH-THROUGH EFFECT, the disclosure of which is hereby incorporated by reference in its entirety.

BACKGROUND

Field

The present disclosure generally relates to semiconductor devices.

Description of Related Art

Certain semiconductor devices are susceptible to over-voltage conditions that can cause damage and/or have other undesirable effects on the devices and/or surrounding circuitry.

SUMMARY

In some implementations, the present disclosure relates to a semiconductor die including a silicon substrate, a bipolar transistor having collector, emitter, base and sub-collector regions disposed on the substrate, and a through-silicon via (TSV) positioned within 35 µm of the sub-collector region in order to clamp a peak voltage of the bipolar transistor at a voltage limit level.

The TSV may be disposed a distance of between approximately 15-25 µm from the sub-collector region of the bipolar transistor. In certain embodiments, the TSV is disposed a distance of approximately 20 µm from the sub-collector region of the bipolar transistor. In certain embodiments, the TSV is disposed a distance of between approximately 10-15 µm from the sub-collector region of the bipolar transistor.

In certain embodiments, the voltage limit level is between approximately 4-9 volts. The bipolar transistor may be a bipolar transistor having a silicon or silicon-germanium alloy base. The silicon substrate may include a high-resistivity portion. Furthermore, the bipolar transistor may be disposed above the high-resistivity portion. The high-resistivity portion may have a resistivity value greater than 500 Ohm*cm. For example, the high-resistivity portion may have a resistivity of approximately 1 kOhm*cm. In certain embodiments, the bipolar transistor is a component of a power amplifier.

Certain embodiments disclosed herein provide a process of fabricating a semiconductor die including providing a silicon substrate, forming a bipolar transistor having collector, emitter and base regions on the substrate, and forming a through-silicon via (TSV) on the substrate within 35 µm of the sub-collector region in order to clamp a peak voltage of the bipolar transistor at a voltage limit level.

The TSV may be formed a distance of between approximately 15-25 µm from the sub-collector region of the bipolar transistor. In certain embodiments, the TSV is formed a distance of approximately 20 µm from the sub-collector region of the bipolar transistor. In certain embodiments, the TSV is formed a distance of between approximately 10-15 µm from the sub-collector region of the bipolar transistor. The voltage limit level is between approximately 4-9 volts.

Certain embodiments disclosed herein provide a radio-frequency (RF) module including a packaging substrate configured to receive a plurality of components and a die mounted on the packaging substrate, the die including a power amplifier including a bipolar transistor having collector, emitter, base and sub-collector regions, the die further including a through-silicon via (TSV) positioned within 35 µm of the sub-collector region in order to claimp a peak voltage of the bipolar transistor at a voltage limit level. The RF module may further include a plurality of connectors configured to provide electrical connections between the die and the packaging substrate.

The TSV may be disposed a distance of between approximately 15-25 µm from the sub-collector region of the bipolar transistor. In certain embodiments, the TSV is disposed a distance of approximately 20 µm from the sub-collector region of the bipolar transistor. In certain embodiments, the TSV is disposed a distance of between approximately 10-15 µm from the sub-collector region of the bipolar transistor.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

Figure 1:
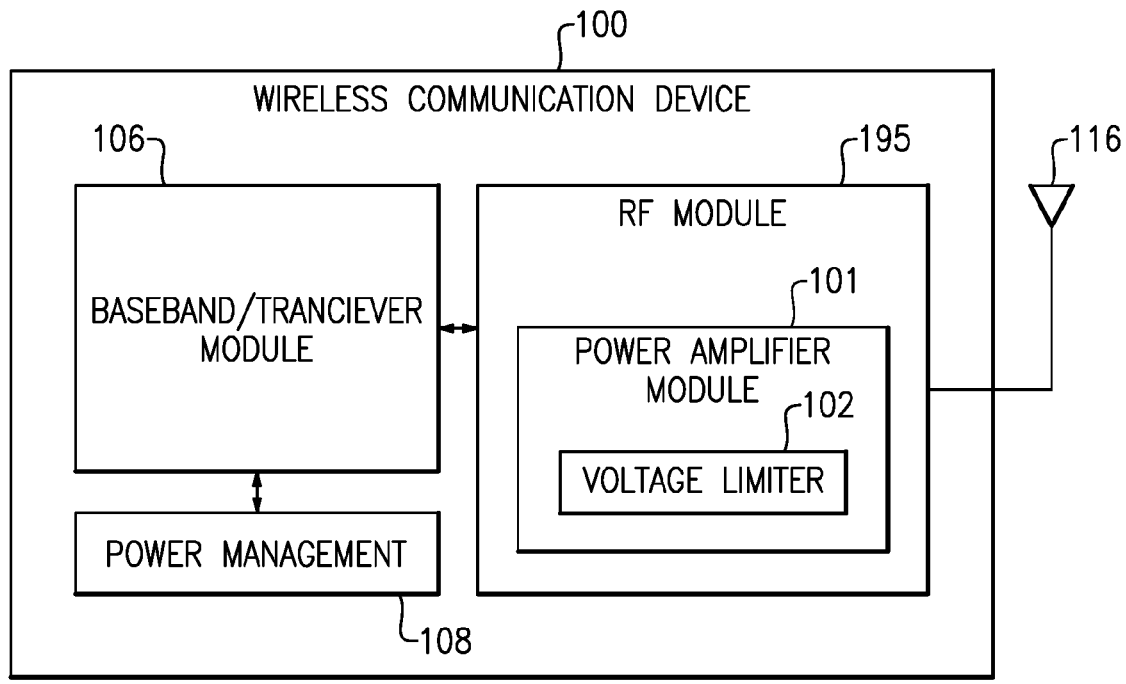
FIG. 1 is a block diagram illustrating a wireless communication device in accordance with one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Wireless transmitters can include power amplification circuitry configured to amplify a signal of interest to an acceptable output power level for transmission thereof. In certain embodiments, power amplifiers operating at relatively high linear output power levels may experience increased susceptibility to over-voltage conditions that can potentially damage the amplifier. Furthermore, impedance mismatch between, for example, a transmitting antenna and an associated transmission line, can contribute to over-voltage susceptibility. In view of the potential adverse effects associated with over-voltage conditions, the presence of one or more voltage-limiting elements in connection with a power amplifier device may be desirable to at least partially prevent or alleviate such effects.

Various solutions may be implemented to protect against over-voltage in power amplifier devices. For example, voltage standing wave ratio (VSWR) sensors utilizing, for example, diode stacks may be used to sense an over-voltage condition, wherein such condition may then be limited in some manner, such as by reducing voltage bias. As another example, power amplifiers may be constructed using certain compound semiconductor technologies, such as gallium arsenide (GaAs) or other III-V compound semiconductor technology, which can have relatively high collector-emitter breakdown voltage characteristics compared to silicon amplifiers. However, such technologies may be relatively expensive or undesirable in certain applications.

Certain embodiments disclosed herein provide for relatively simple and/or effective voltage-limiting functionality in power amplifier devices. For example, certain embodiments include a voltage limiter element connected to, or in proximity to, the power delivery device of a power amplifier, such as a collector region of a bipolar amplifier device. Certain embodiments provide a limiting device constructed using existing technology elements (e.g., ground-connection vias) in a silicon-germanium (SiGe) BiCMOS semiconductor technology process.

Certain embodiments disclosed herein provide for voltage limiting for a bipolar amplifier device through the formation of a through-silicon via (TSV) proximate to the device collector. For example, in a bipolar transistor, a depletion region may form under high voltage conditions that extends laterally to the TSV metal wall, such that electrical current may be shunted through the TSV. The TSV may thereby substantially provide voltage-limiting/clamping functionality. Variation in the proximity of the TSV to the device may at least partially determine the level of over-voltage protection, which may be a function of the power and/or VSWR applied.

FIG. 1 is a block diagram illustrating an embodiment of a wireless communication device. Although described with particular reference to a wireless communication device, such as a mobile telephone or other mobile computing device, systems and methods for power amplifier over-voltage protection as described herein may advantageously be applicable in any device or system including a power amplifier, or other device for which over-voltage protection may be desriable. Power amplifier over-voltage protection as described herein may be implemented as part of an integrated module that contains other circuit elements, or can be implemented as a discrete power amplifier/control module.

Systems and methods for power amplifier over-voltage protection as described herein may be implemented in hardware. Such hardware implementations may include one or more discrete electronic components, integrated electronic components, discrete logic circuits having logic gates for implementing logic functions upon data signals, application specific integrated circuits (ASIC) having appropriate logic gates, field-programmable gate arrays (FPGA), and/or the like.

Embodiments of systems and/or methods of over-voltage protection can be implemented in any device having an RF power amplifier, such as a wireless communication device 100. The wireless communication device 100 illustrated in FIG. 1 may be a simplified example of a mobile phone, for example. For simplicity, certain operational/implementation details of the wireless communication device 100 are omitted from the diagram and/or the accompanying text. The wireless communication device 100 includes a baseband and/or transceiver module 106 and a radio-frequency (RF) module (e.g., a front end module) 195, including a power amplifier module 101 having one or more voltage limiting elements 102 associated therewith. The baseband/transceiver module 106 may include modulation and/or upconversion circuitry for preparing a baseband information signal for amplification and transmission, and may include filtering and/or downconversion circuitry for receiving and down-converting an RF signal to a baseband information signal to recover data. While illustrated as a single module, the module 106 may be physically and/or logically separated into one or more separate baseband and/or transceiver blocks, chips, modules, etc.

The baseband/transceiver module 106 may include one or more of the following: a processor, such as a general purpose or special purpose microprocessor; a memory; application software; analog circuit elements; digital circuit elements; input/output (I/O) elements; and/or power amplifier software; coupled, for example, over a system bus. The system bus may include physical and/or logical connections to couple the above-described elements together and enable their interoperability.

The power amplifier module 101 may be susceptible to over-voltage conditions in certain embodiments, which may be a result of various operational factors. For example, impedance mismatch may cause problematic standing waves to be present at the power amplifier, thereby resulting in over-voltage. Furthermore, fluctuations and/or inconsistencies in power supply to the power amplifier module may contribute to over-voltage susceptibility. In certain embodiments, the wireless communication device 100 includes a power management module 108 configured to provide power to the amplifier module. The power management module 108 may include a local power source, such as a battery, or other rechargeable power source, or may include an adaptor that converts AC power to the correct voltage used by components of the wireless communication device 100. In some embodiments, the power management module 108 may be coupled to an external power source, such as, for example, an alternating current (AC) power adaptor or charger, a direct current (DC) vehicle adaptor or charger, or another external power source. In certain embodiments, power from an external power source may cause an over-voltage supply condition within the wireless communication device 100. For example, in the case of an AC adaptor or charger, the external power source can be susceptible to voltage conditions at an AC input that may cause the external power source to supply a greater than desired voltage to the wireless communication device 100. Similarly, in the case of a DC vehicle adaptor or charger, the external power source can be susceptible to voltage conditions on the DC input that may cause the external power source to supply a greater than designed voltage to the wireless communication device 100. Therefore, it may be desirable for the power amplifier module 101 to include voltage-limiting functionality protect the device from supply voltage inconsistencies and/or fluctuations.

In an embodiment, the RF module 195 includes one or more transmit/receive (TX/RX) switches, such as one or more duplexers, diplexers, or any other physical or logical devices or circuitry configured to separate transmit and receive signals. In certain embodiments, the output of the power amplifier module 101 is provided over connection to such switch(es), and further to an antenna 116.

In some implementations, the power amplifier module 195 shown in FIG. 1 includes multiple amplification stages. Furthermore, the power amplifier module 195 may integrate matching circuitry, out of band rejection filters, power detectors, and/or bias controls. The power amplifier module 195 may include a power amplifier controller for setting, modifying, or adjusting the amount of power amplification provided by the power amplifier, and/or performing other functionality. The power amplifier module 195 may be a single integrated component that includes the functionality of a power amplifier controller and one or more power amplifiers. In other implementations, the wireless device 100 may include separate power amplifier control circuitry and power amplifier(s).

Figure 2:
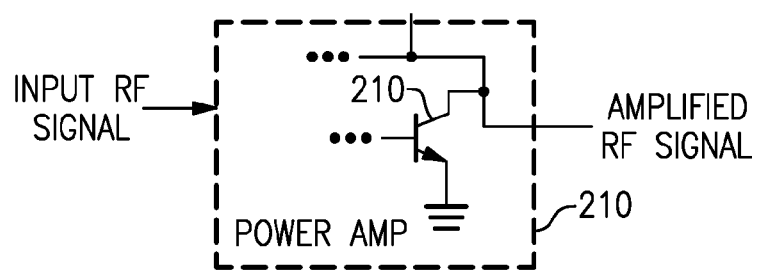
FIG. 2 provides a schematic diagram of a power amplifier in accordance with one or more embodiments.

FIG. 2 provides a schematic diagram of an individual power amplifier 201 that may be used in a power amplifier module such as that shown in FIG. 1. The power amplifier 201 may receive an RF signal and provide the RF signal to one or more transistor stages. In certain embodiments, the power amplifier 201 includes a bipolar junction transistor (BJT) 210, wherein the base of the transistor receives the RF signal to be amplified. The transistor 210 may be grounded at its emitter and the voltage level provided at the base of the transistor may control current passing between a collector portion and the emitter portion. The collector may provide an output signal which corresponds to an amplified version of the input RF signal provided to the power amplifier. Various other configurations of power amplifiers may be used in accordance with embodiments disclosed herein and may include power amplifiers comprising any suitable type or configuration of transistor or transistors. The PA 201 may be one amplifier of a multi-stage power amplifier module. The power amplifier 201 may be based on SiGe BiCMOS technology, which may use, or leverage, a low impedance path to ground with one or more through silicon vias.

The transistor 210 may be an NPN transistor or a PNP transistor. Although certain embodiments of transistors and substrates are described herein in the context of NPN devices, or other impurity-type devices, it should be understood that any of the embodiments disclosed herein may comprise collector regions, wells, and/or bulk substrates having any suitable or desirable type or level of doping, such as heavy or light n-type or p-type doping.

Figure 3:
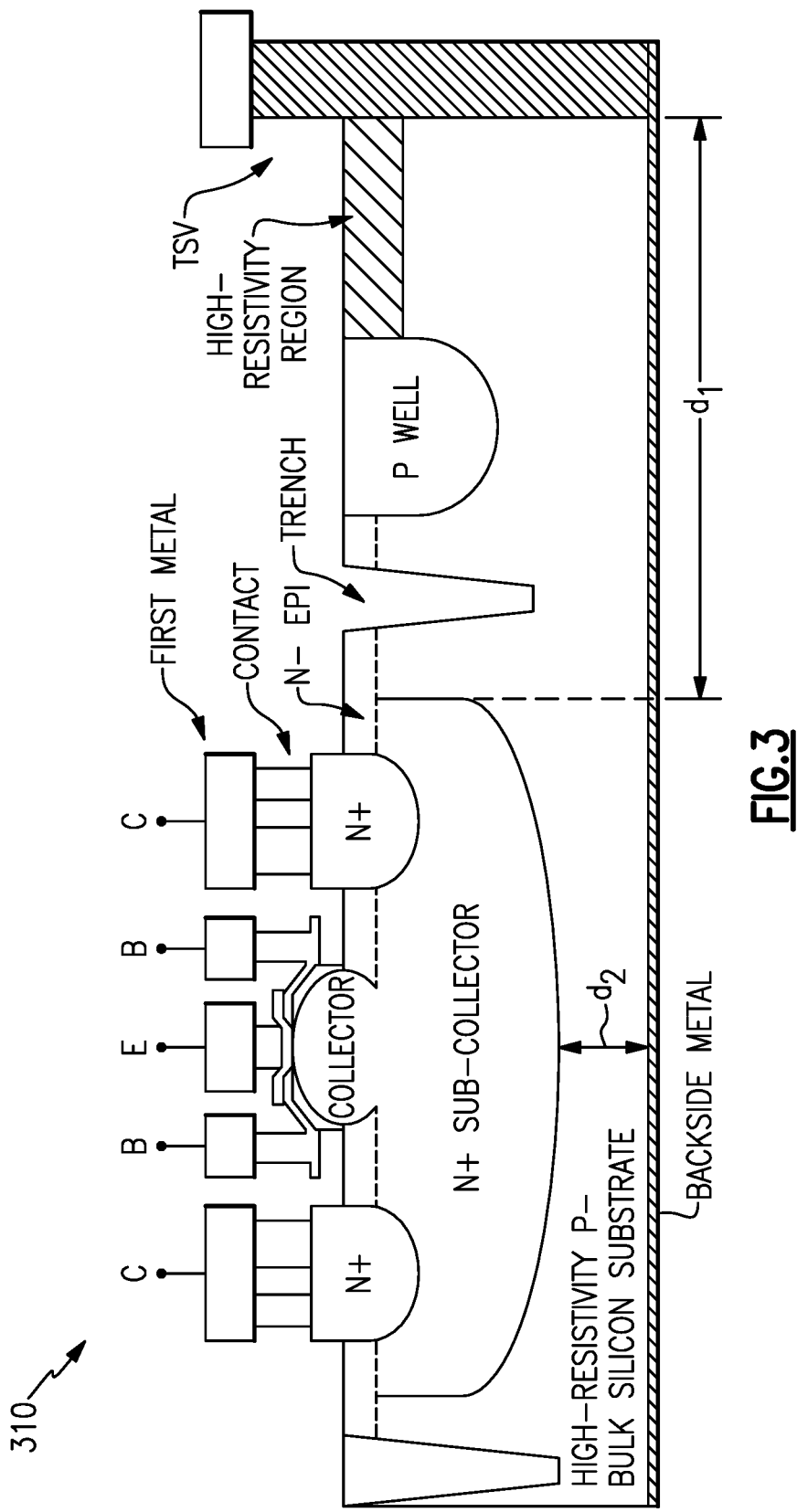
FIG. 3 illustrates a cross-sectional view of an embodiment of a bipolar transistor in accordance with one or more embodiments.

FIG. 3 illustrates a cross-sectional view of an embodiment of a bipolar transistor 310 formed on high-resistivity bulk silicon substrate. In certain embodiments, the transistor 310 may be formed using SiGe/Si technology, and may be an NPN, PNP, or other type of transistor. Although SiGe technologies can be built using low-resistivity bulk substrate, this low-resistivity may result in certain disadvantages that may make full FEM integration less feasible or desirable. For example, with low-resistivity, there is often feedback due to poor isolation between devices integrated on the silicon surface. Unwanted signals from one device can travel through the low-resistivity substrate to adversely affect the performance of other devices processing other signals. In certain embodiments, effects of low-resistivity substrate are attenuated or avoided by building SiGe devices on, or adjacent to, high-resistivity substrate. Such techniques can allow for similar design approaches to those implemented in GaAs-based technologies. As silicon wafers are often less expensive than GaAs wafers, among other advantages, using SiGe technology may provide cost benefits.

Use of SiGe/Si technology may allow for formation of transistors having faster operation than traditional Si transistors. In certain embodiments, the device of FIG. 3 includes a layer of high-resistivity bulk substrate, such as silicon having resistivity characteristics greater than 50 Ohm*cm. In certain embodiments, the bulk substrate is a high-resistivity p-type silicon. The high-resistivity layer may have resistivity of around 1000 Ohm*cm, for example. As shown in FIG. 3, the transistor 310 includes an n+ type sub-collector region, which may comprise, for example, heavy Arsenic implant. However, the sub-collector, and/or other portions of the transistor 310 may comprise various types/materials, depending on the technology utilized.

In certain device manufacturing processes, an epitaxial layer of low-resistivity substrate (e.g., n-type epitaxial layer ("n-epi")) may be formed near a top surface of the bulk silicon substrate. For example, during processing, Arsenic, or other material from the implanted sub-collector regions may out-diffuse and redeposit on the surface of the silicon substrate, forming the low-resistivity layer. In certain embodiments, the n-epi layer may have a resistivity of around 1-100 Ohm*cm and may be approximately 1 µm in thickness. Additionally, the application of silicon dioxide on the surface of high resistivity silicon substrates, as may be used in SiGe/Si device manufacturing processes, may introduce fixed charges which attract free carriers and further decrease the bulk resistivity near the surface. Formation of such a layer at the surface may be undesirable, as its low-resistivity nature may result in unwanted parasitic current conduction leading to leakage, cross talk, high frequency losses, and susceptibility to external electric fields that induce non-linearity and harmonic distortion.

In order to at least partially alleviate potential concerns introduced by the low-resistivity layer, the wafer may be treated with a substance that at least partially damages or alters the structure of the low-resistivity layer. For example, in certain embodiments, Argon gas may be implanted in the wafer to at least partially destroy the silicon lattice in that region. Argon, being a noble gas, is inert and therefore may not react chemically with the silicon, or other material. It may not be desirable to implant lattice destroying agent in close proximity to an active device, or any device that relies on single-crystal substrate. Therefore, in certain embodiments, the treatment of the wafer with lattice destroying agent (i.e., high-resistivity implant) is done selectively in regions at least a predetermined distance away from an active device, such as a bipolar transistor. For example, the high-resistivity implant may be implanted at least one micrometer laterally away from devices that would be adversely affected by the implant. In certain embodiments, the high-resistivity implant is implanted at least 10 µm from the transistor 310. In certain embodiments, the high-resistivity implant is implanted 5-10 µm from an active device.

Various other methods of addressing parasitic conduction issues associated with low-resistivity may be used in place of, or in addition to, the high-resistivity implant discussed above. For example, in certain embodiments, the wafer may be treated with a layer of polysilicon or amorphous silicon prior to oxide application (i.e., a "trap-rich" layer), which is configured to lock the free carriers up, thereby inhibiting mobility at operating frequencies. Such a method may be suitable for SOI applications, and may be capable of withstanding high temperature conditions needed for CMOS processing. In addition, any other suitable or desirable mechanism for restoring high-resistivity characteristics of the wafer may advantageously be utilized in connection with embodiments disclosed herein. Furthermore, one or more trenches, as shown, may be etched into the wafer, thereby impeding the movement of carriers in the substrate across the trench(es). In certain embodiments, the trench(es) may have a depth of approximately 3-4 μm.

Although high-resistivity substrate may be conducive to desirable bipolar transistor construction, it may be desirable for certain devices, such as CMOS, to be associated with low-resistivity substrate. For example, in certain embodiments, one or more devices, such as CMOS FET devices and/or SiGe bipolar HBT devices, may be grown on a bulk silicon substrate. Due to undesirable effects of high-resistivity substrate on certain devices, low-resistivity substrate (e.g., p-type implant ("p well")) may be implanted beneath, or adjacent to, such devices. Therefore, the transistor 310 may benefit from low resistivity p-well diffusion and contact to the substrate, as well as, possibly, a surrounding high-resistivity region. The p well may comprise a band that at least partially surrounds the collector of the transistor 310, or may be a local diffusion area close to the collector. As a p-well band, there may be one or more certain critical distances from the n-well that minimizes or substantially reduces NPN collector-junction capacitance and harmonic generation. In certain embodiments, without a band of p-well, the collector n-well would not be adequately isolated from the n-epi layer that is grown on top of the high resistivity substrate unless the isolation is achieved by rendering the n-epi layer to high resistivity by some implant, counter doping, deep trench, or the like.

In certain embodiments, a pocket of charge may collect in a region between the trench and p well shown in FIG. 3. Therefore, it may be desirable for the trench to be disposed immediately adjacent to the p well in order to avoid such charge collection. In certain embodiments, a high-resistivity device such as that shown in FIG. 3 does not comprise a trench between the sub-collector region and p well. The p well may serve to limit the width of a depletion region, thereby increasing capacitance at the n well/p well junction. The embodiment depicted in FIG. 3 includes a high-resistivity implant region disposed adjacent to the p well.

The transistor 310 of FIG. 3 may have one or more voltage-limiting elements associated therewith. For example, FIG. 3 includes a through-silicon via (TSV) formed a lateral distance $d_1$ away from the sub-collector region of the transistor 310. In certain embodiments, the distance $d_1$ is selected such that a depletion region extending from the sub-collector may reach the TSV under certain high-voltage conditions, thereby allowing electrical current to be shunted to ground through the TSV. The TSV may therefore provide voltage-limiting functionality, wherein the distance $d_1$ at least partially determines the voltage limit level. In certain embodiments, the distance $d_1$ is less than approximately 40 μm. For example, the distance $d_1$ may be less than approximately 35 μm. In certain embodiments, the distance $d_1$ is less than approximately 30 μm. For example, the distance $d_1$ may be between approximately 15 μm and 25 μm, or between approximately 10 μm and 15 μm. In an embodiment, the distance $d_1$ is approximately 20 μm. For example, a distance $d_1$ of approximately 20 μm may be utilized in a WLAN power amplifier. In yet another embodiment, the distance $d_1$ may be approximately 6 μm or less.

In lower-resistivity applications, it may be desirable for the TSV to be positioned in closer proximity than in high-resistivity applications in order to achieve the same limiting voltage level. In certain embodiments, the TSV includes a contact pad for providing an electrical connection with the TSV. The TSV may pass through the substrate to make electrical contact with a backside metal plane or region, which may provide a ground reference for one or more elements of the transistor 310. In certain embodiments, the TSV provides a metal to silicon interface, which may present an ohmic or Schottky contact, depending possibly on the metal workfunction. Alternatively, the TSV may include an insulating liner; however, as insulation about the TSV may at least partially prevent clamping behavior as described herein, use of TSV insulation may unnecessarily increase cost and/or negatively impact clamping functionality.

FIG. 3 further illustrates a dimension $d_2$, which provides a vertical distance between the sub-collector region and the back of the wafer. In certain embodiments, the distance $d_2$ may allow for voltage clamping as described herein, wherein electric charge may propagate to ground via the backside metal in the presence of voltage above a certain threshold at one or more terminals of the transistor device 310. In order to design and/or implement a desired voltage-clamping distance $d_2$, a process may be implemented in which a back side of the substrate wafer may be back-grinded to reduce the dimension $d_2$ to a desirable distance. In certain embodiments, the wafer may be back-grinded such that the distance $d_2$ has a value of less than 100 μm. For example, the distance $d_2$ may have a value of between approximately 80-90 μm or less. In certain embodiments, the distance $d_2$ may have a value of less than 50 μm. For example, the distance $d_2$ may have a value of approximately 20 μm or less.

Use of one or more TSVs to limit the collector voltage may advantageously provide over-voltage protection without the need for extra circuitry beyond the TSV(s). As depletion region formation is inherent in certain semiconductor configurations, systems and methods disclosed herein may be configured to take advantage of such inherent behavior to improve performance. Furthermore, solutions disclosed herein may provide one or more of the following advantages: relatively small/compact design; relatively inexpensive fabrication; substantially complete recoverability; relatively fast recovery; absence or reduction of oxide damage from transistor snapback.

The calculation and design of the distance $d_1$ (or $d_2$) may depend at least in part on the relevant modulation scheme being employed and/or the relevant power level of operation of the circuitry. That is, the distance chosen may be based on the type of signal that the associated amplifier is amplifying. For example, for an orthogonal frequency-division multiplexing (OFDM) solution, which generally may involve a relatively high peak-to-average-power (PAPR) (e.g., 802.11ac), such as approximately 7-8 dB, or more, it may be desirable for the distance $d_1$ (or $d_2$) to be relatively longer to prevent undesirable signal distortion. On the other hand, for a lower PAPR modulation, such as frequency-shift keying (FSK), or the like, it may be possible/desirable for the distance $d_1$ (or $d_2$) to be relatively shorter in order to more effectively clamp unwanted voltages. Furthermore, if the power level being produced in the amplifier (or other device)

is high (e.g., 20 dBm or higher), then the distance $d_1$ (or $d_2$) may be relatively greater than in corresponding lower-power solutions.

Although certain embodiments of systems/devices including voltage-clamping TSV placement or dimensional design are disclosed herein in the context of power amplifier devices, principles disclosed herein may be applicable in other devices/systems. For example, it may be desirable to utilize voltage clamping as described herein for any semiconductor device comprising a terminal for which it may be desirable to at least partially prevent voltage present at the terminal from building above a particular level or threshold. Examples of devices that may be formed in connection with one or more voltage-clamping features as described herein may include comparators, operational amplifiers, diodes, or the like. For example, any device susceptible to electrostatic discharge may beneficially include voltage-clamping features, which may provide protection for one or more regions of the associated circuit.

Figure 4:
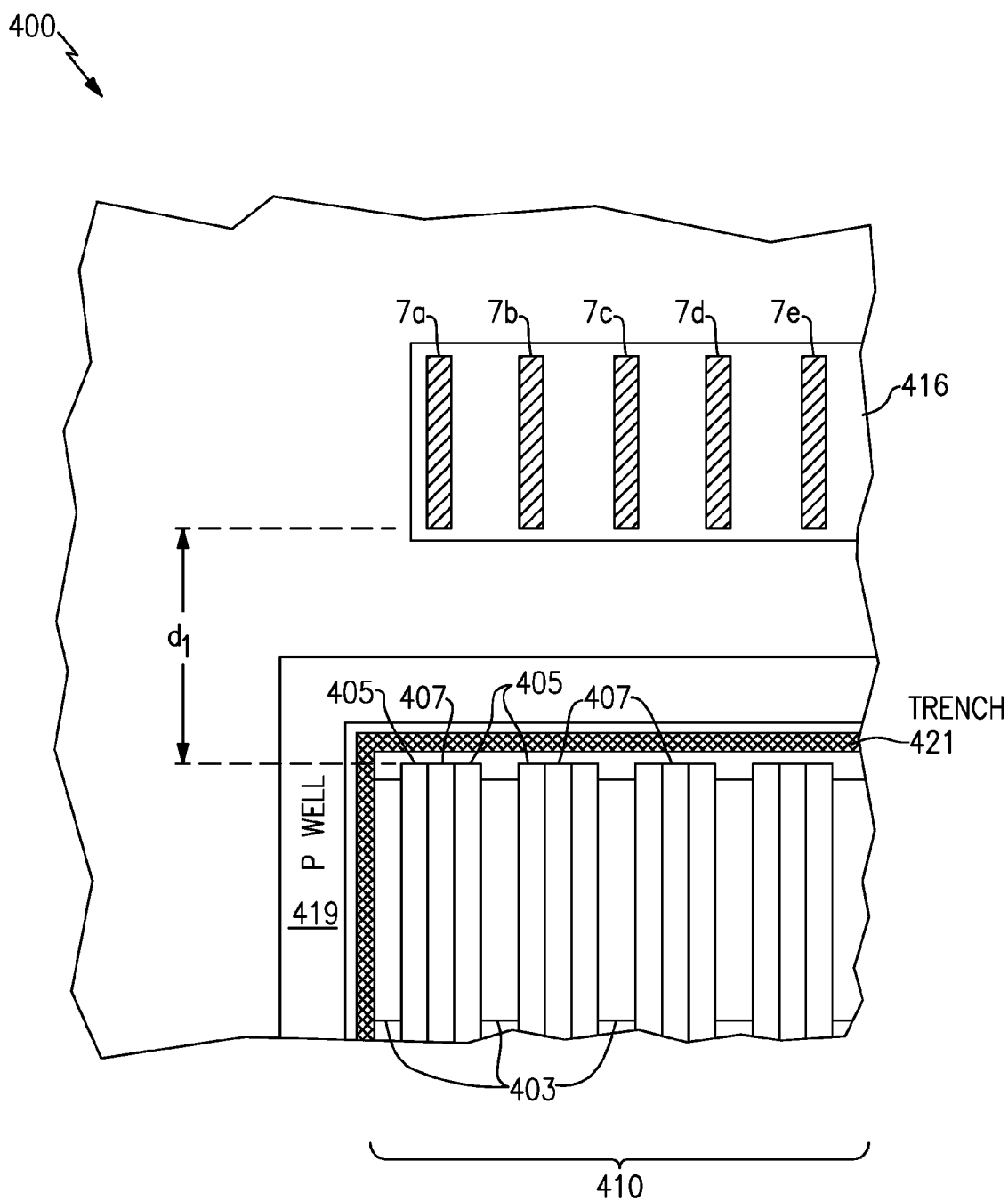
FIG. 4 illustrates a top view of one or more bipolar transistors having one or more over-voltage protection TSVs disposed in proximity thereto in accordance with one or more embodiments.

FIG. 4 illustrates a top view of one or more bipolar transistors 410 (e.g., NPN) having one or more over-voltage protection TSVs disposed in proximity thereto. The one or more transistors 410 may include a plurality of collector regions 403, base regions 405 and emitter regions 407. In certain embodiments, the one or more transistors 410 may comprise common-emitter amplifiers.

The device layout 400 shown may further include one or more metal or other conductive forms or components (not shown) configured to electrically couple one or more of the bipolar transistors 410 to one or more through-silicon vias 7a-d, which may comprise, for example, tungsten or other metal. In particular, the metal connector structure(s) may be coupled between one or more emitter contacts of the one or more transistors 410 and one or more TSVs. One or more additional metal or other conductive forms or pieces 416 may be formed or disposed in contact with the one or more vias 7a-d, which may at least partially electrically couple the one or more vias 7a-d to one another and/or the transistor(s) 410.

The one or more transistors 410 may be at least partially surrounded by one or more doped well regions 419 (e.g., p well), and or trenches 421, which may provide electrical isolation for the one or more transistors 410 with respect to one or more adjacent devices or components of the system 400.

The dimension $d_1$, which measures a lateral dimension from the edge of the sub-collector (e.g., n+ sub collector) to the one or more TSVs 7a-d, may be designed to provide voltage-clamping as described herein. Furthermore, the dimension $d_1$ may have a value as described above with respect to FIG. 3. That is, the distance of the TSV(s) from the transistor(s) 410 may result in avalanching, wherein free carriers are prone to flow from the sub-collector region to the ground path presented by the TSV(s), thereby effectively clamping the voltage at one or more terminals of the transistors 410 in a relatively abrupt fashion.

Figure 5:
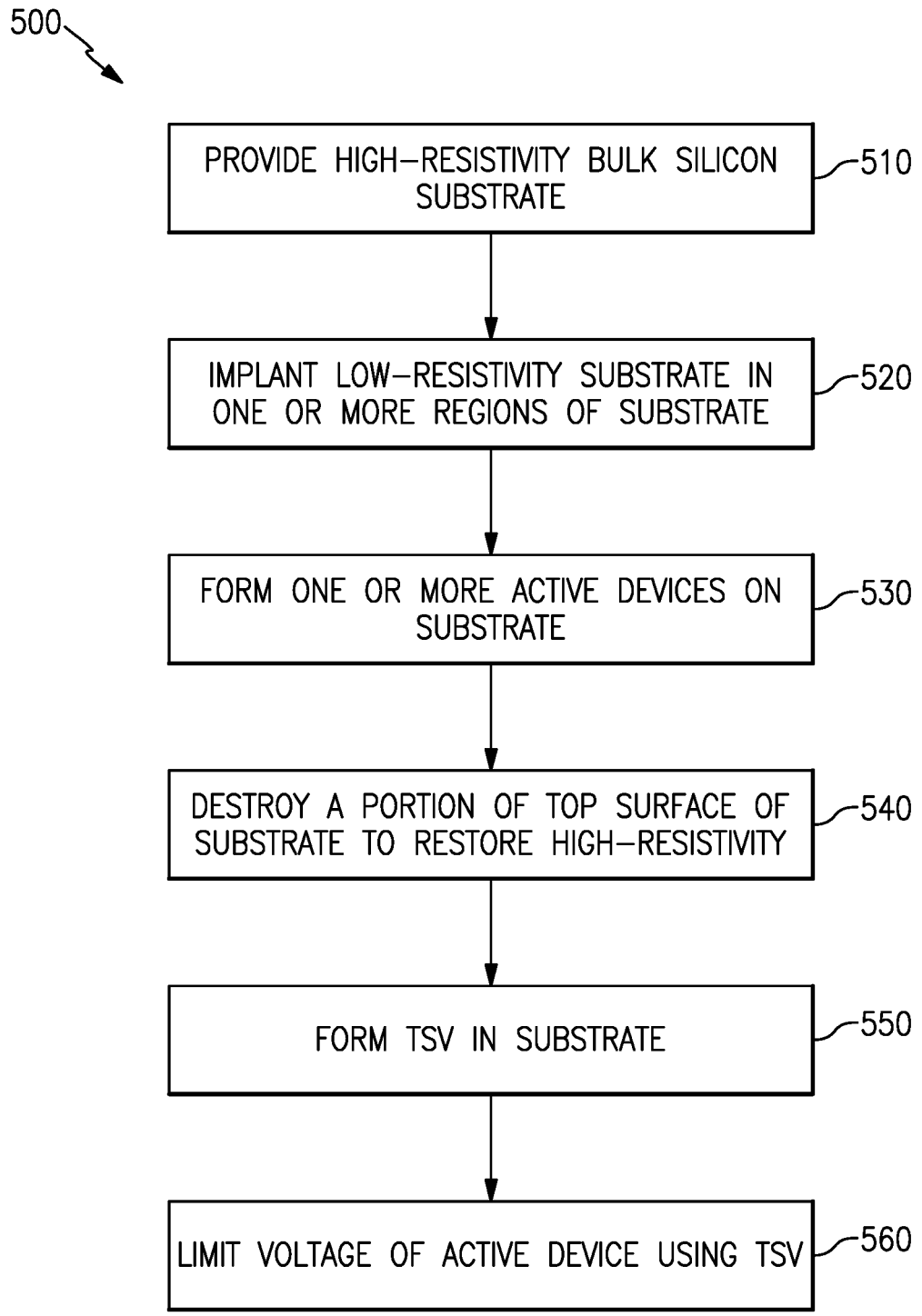
FIG. 5 is a flow diagram for a process for fabricating an amplifier device having through-silicon via over-voltage protection in accordance with one or more embodiments.

While the flow of carriers between the sub-collector and the TSV(s) may generally produce increased thermal energy in the region of the bulk substrate bridging between the sub-collector and the TSV(s), the relatively high resistance of such region may substantially prevent potentially damaging over-heating of the device in the clamping condition. That is, the resistance of the region may effectively provide negative feedback substantially preventing the increase of electrical current beyond a certain point. FIG. 5 illustrates a flow chart for a process 500 for fabricating an amplifier device having through-silicon via over-voltage protection in accordance with one or more embodiments of the present disclosure. The process 500 may involve fabricating a bipolar transistor according to SiGe BiCMOS technology. In certain preferred embodiments, the process is carried out in a manner that minimizes the susceptibility of the amplifier device to over-voltage conditions. The process 500 may involve providing at least a portion of a high-resistivity bulk silicon substrate at block 510, which may be grown, for example, using a silicon seed. When growing the high-resistivity substrate, it may be desirable to do so in such a manner as to maintain a resistivity that has relatively tight control, which may depend largely on the amount of oxygen precipitate (Oi) present in the substrate. That is, it may be desirable to grow a substrate whose resistivity and intrinsic carrier type (p versus n) is not prone to substantial alteration during subsequent processing. In certain embodiments, excess oxygen precipitate in the bulk substrate can cause type-conversion of the substrate during manufacturing of the SiGe and CMOS processes, such as from p-type to n-type. Type conversion can lead to substantial increase in depletion widths, causing undesirable interference or punch-through between devices.

As illustrated above in connection with FIG. 3, the process 500 may further include implanting low-resistivity implant in certain regions of the wafer. For example, such low-resistivity implant may be configured such that various RF devices may be at least partially surrounded by the implant, and/or various non-RF devices may be formed on the implant. The low-resistivity implant may allow for effective contact between one or more devices and the underlying substrate by limiting depletion width.

At block 530, one or more active devices are formed on the substrate. Examples of such devices may include transistors of various types. As described above, during manufacturing process of high-resistivity silicon wafers, an epitaxial layer of relatively low-resistivity silicon may form on an upper surface of the wafer. Therefore, the process 500 may include a step 540 that involves destroying at least a portion of the low-resistivity epitaxial layer in selected regions to restore high-resistivity characteristics of the substrate in those regions. This step is illustrated at block 540, and may be performed by treating the surface of the substrate with Argon gas, thereby at least partially destroying the crystal lattice in that region.

At block 550, one or more through-silicon vias are formed in the substrate. For example, the TSV may provide an electrical connection through the bulk semiconductor substrate and/or the high-resistivity portion of the substrate to a backside metal or the like. The TSV may be formed a desirable distance from a sub-collector portion of one or more active devices, such that the TSV provides at least partial over-voltage protection for the device(s). At block 560, the process 500 involves limiting the voltage on one or more active devices using the TSV(s).

Figure 6A:
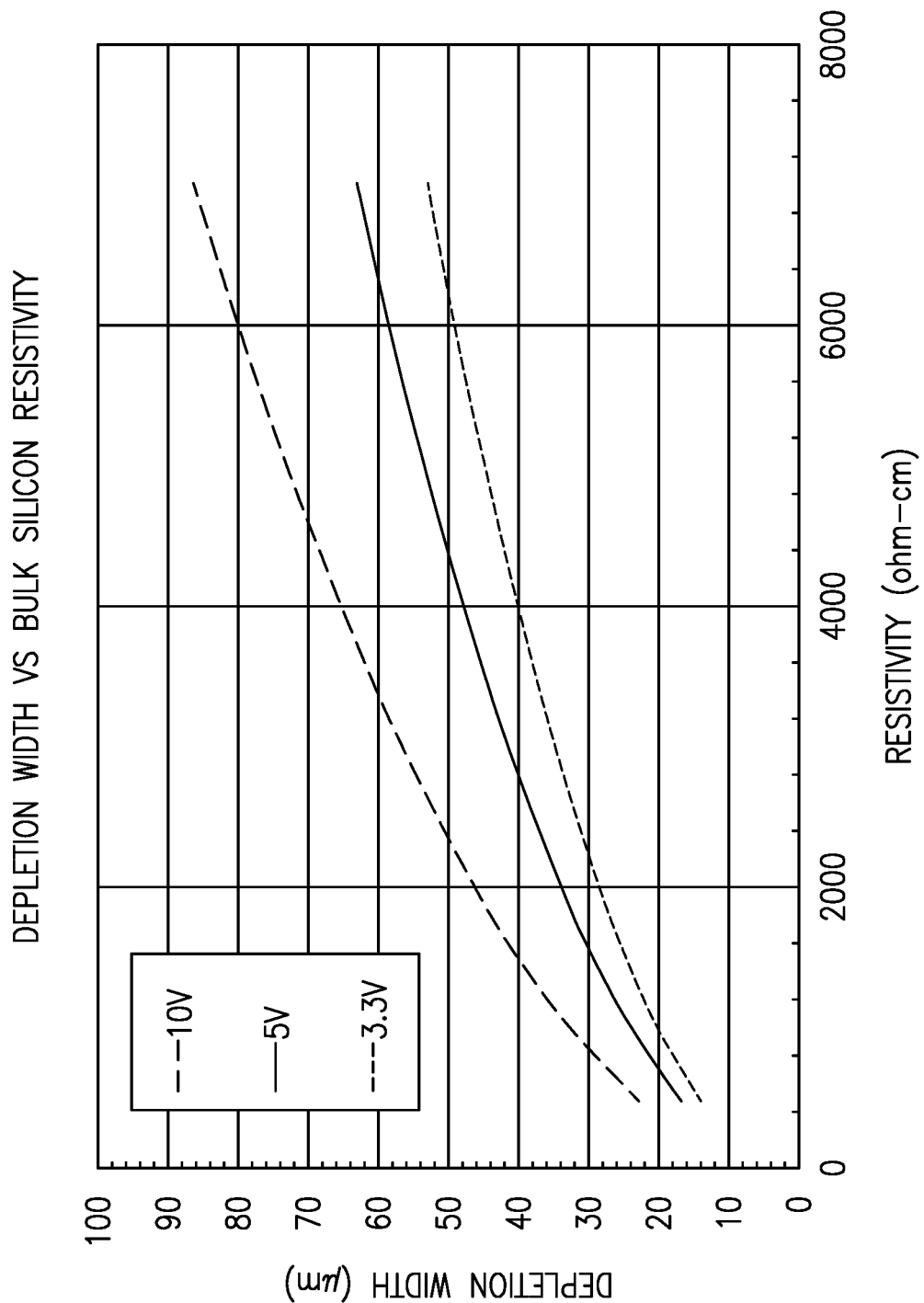
FIG. 6A illustrates a graph showing possible relationships between bulk silicon resistivity and depletion width in accordance with one or more embodiments.

FIG. 6A illustrates a graph showing possible relationships between bulk silicon resistivity and depletion width. As described herein, TSVs may be positioned a pre-determined distance from a device sub-collector region to allow for the depletion region to extend to the TSV wall(s) under certain high-voltage conditions. As demonstrated by the graph of FIG. 6A, such distance may depend at least partially on the resistivity of the underlying substrate. While certain embodiments are disclosed herein in the context of high-resistivity bulk substrate, the principles described may be applicable to any practical resistivity characteristics, wherein the placement of the TSV(s) may be at a greater relative distance for higher-resistivity applications.

Figure 6B:
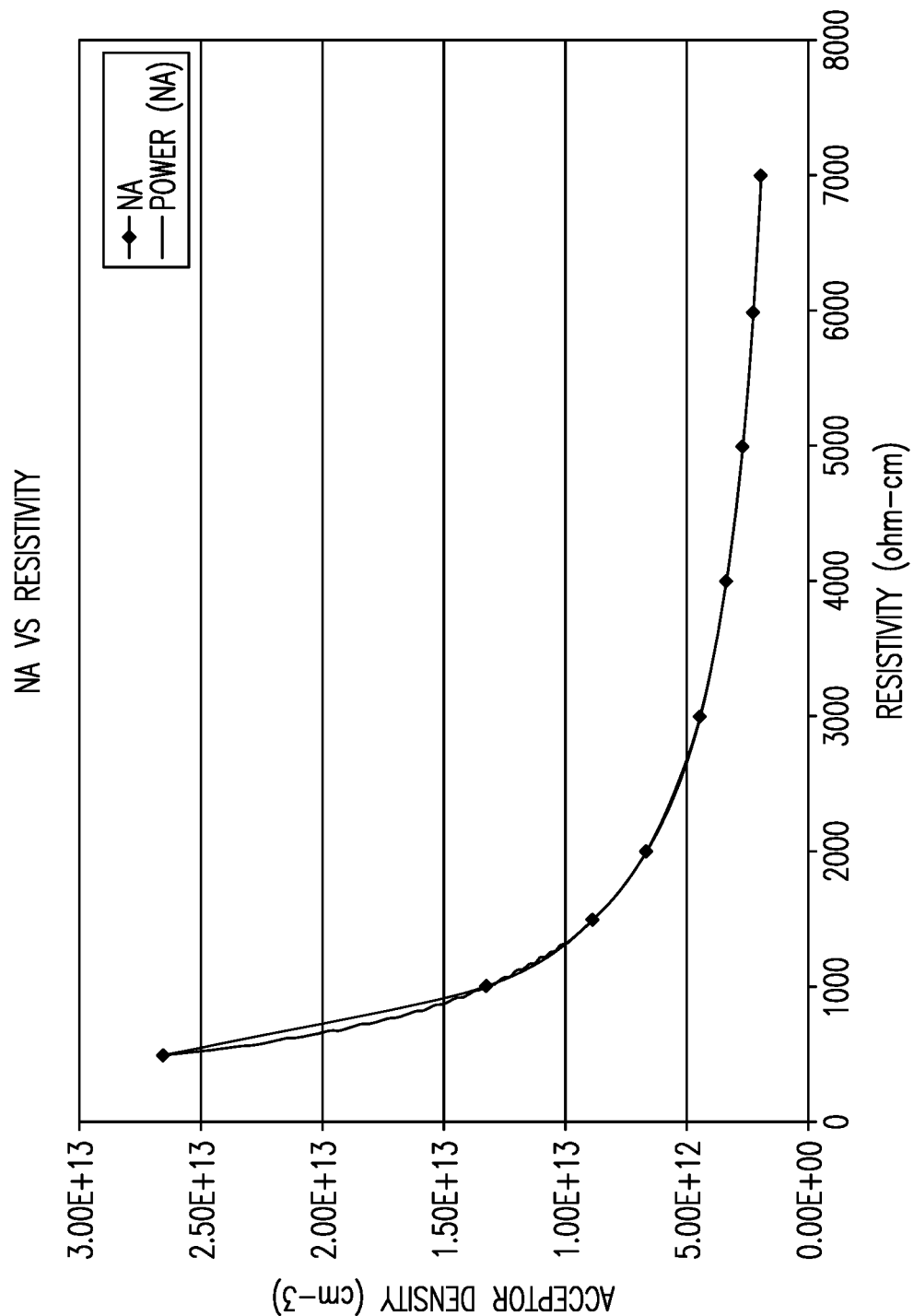
FIG. 6B illustrates a graph showing possible relationships between substrate doping level and resistivity in accordance with one or more embodiments.

FIG. 6B illustrates a graph showing possible relationships between substrate doping level and resistivity. In certain embodiments, substrate resistivity can be controlled and/or determined by acceptor/donor density level. As described above, the substrate resistivity may determine where over-voltage protection TSV(s) are to be formed to achieve a given voltage limit level.

FIGS. 7A-7D are graphs showing potential punch-through behavior for transistors having TSVs disposed at various distances from n-type diffusion (or p-type, depending on transistor configuration). Collectively, the curves of FIGS. 7A-D demonstrate the correlation of harmonic versus DC characteristics of TSV proximity configurations.

Figure 7A:
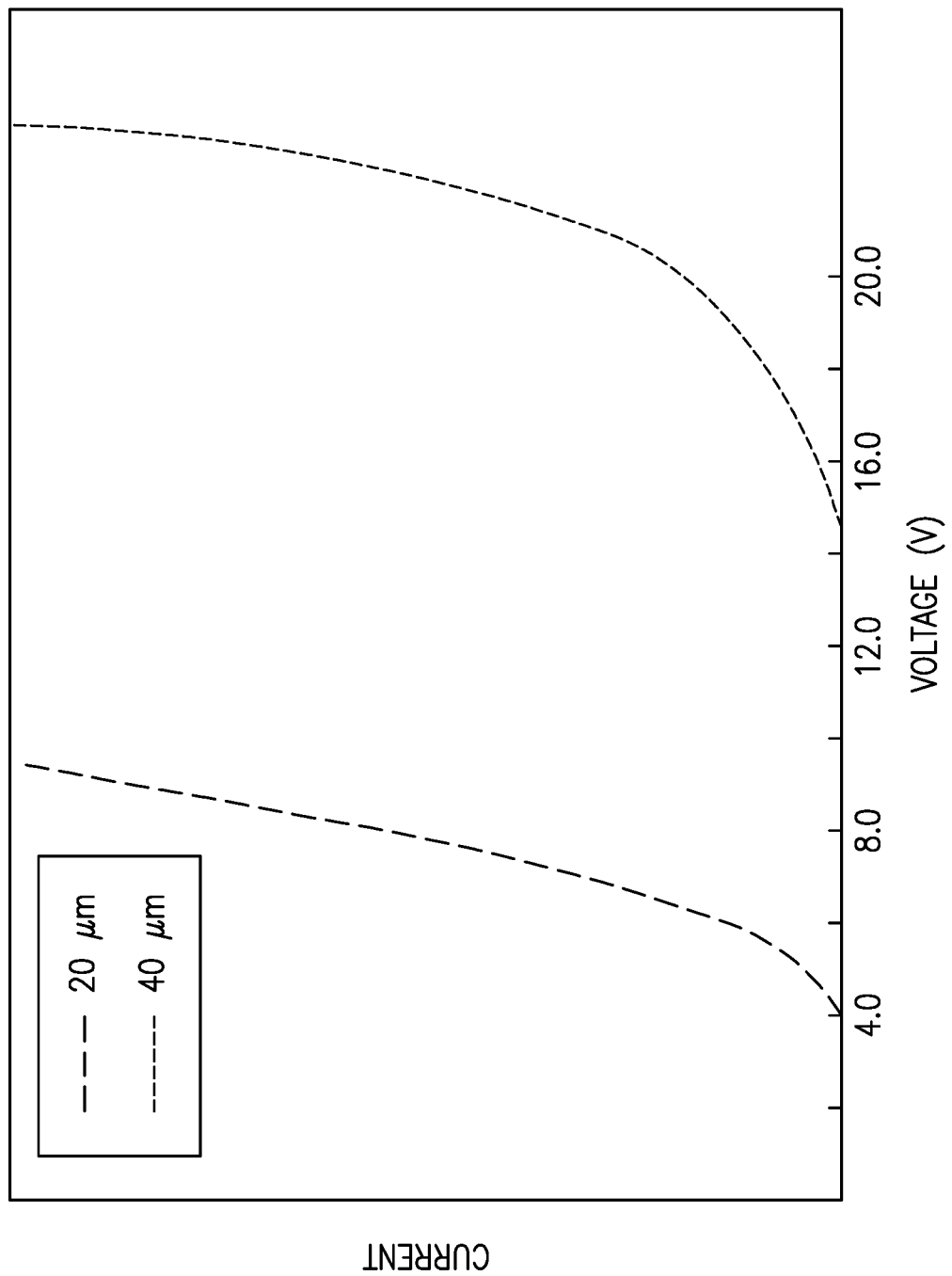
FIGS. 7A-7D are graphs showing potential punch-through behavior for transistors associated with one or more voltage-clamping TSVs in accordance with one or more embodiments.

The graph of FIG. 7A shows leakage current between the n-type diffusion edge and the TSV. FIG. 7A includes a first curve corresponding to a TSV distance of, for example, 20 µm, as well as a second curve corresponding to a TSV distance of, for example, 40 µm. It can be seen in FIG. 7A that in an embodiment with a TSV distance of approximately 20 µm, punch-through may be experienced starting at a DC voltage level of approximately 4 V, whereas in an embodiment with a TSV distance of approximately 40 µm, punch-through may not be experienced until approximately 14 V, or some other value.

Figure 7C:
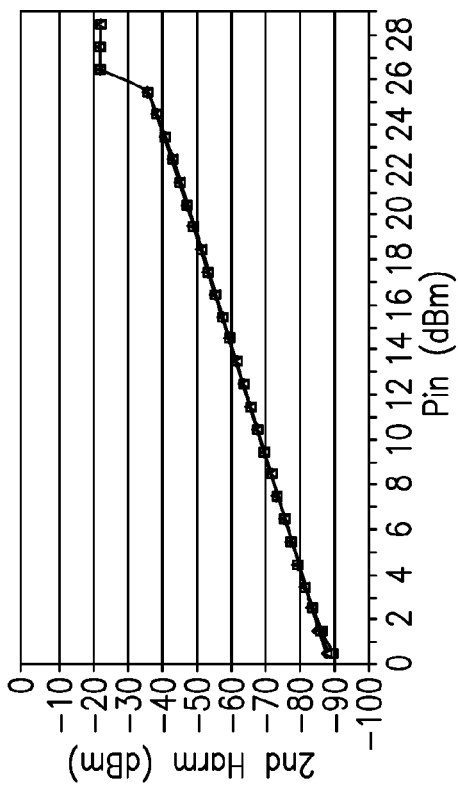
Figure 7B:
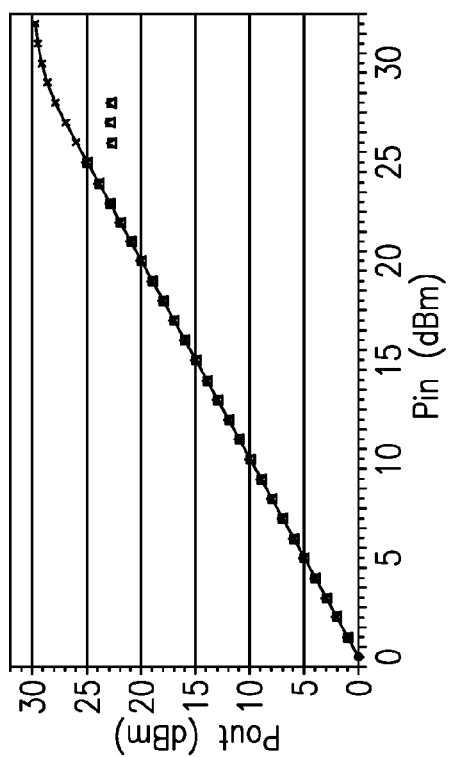
Figure 7D:
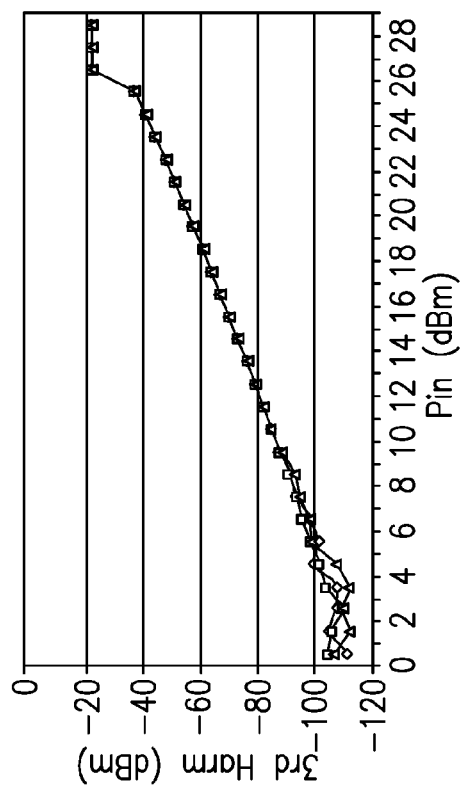

FIG. 7B shows a representation of $1^{st}$ harmonic characteristics with respect to input power and output power. FIG. 7C shows a representation of $2^{nd}$ harmonic characteristics, while FIG. 7D shows a representation of $3^{rd}$ harmonic characteristics. Data in one or more of the graphs may correspond to transistor configurations in which primarily epitaxial silicon is disposed above the depletion region in a first configuration, or in which a deep p-type well is present, as described above. Because the relevant leakage current is experienced primarily at a depth below the p-type well, the presence of the well may not have a significant effect on punch-through in certain embodiments.

Although certain of the graphs may be representative of DC behavior, the principles demonstrated may also be applicable to large-signal AC conditions. In certain embodiments, under RF excitation, punch-through may be experienced in a similar manner to that of DC. The graphs of FIGS. 7A-7D demonstrate that TSV distance may have a substantial impact on leakage and/or harmonic performance.

Figure 8A:
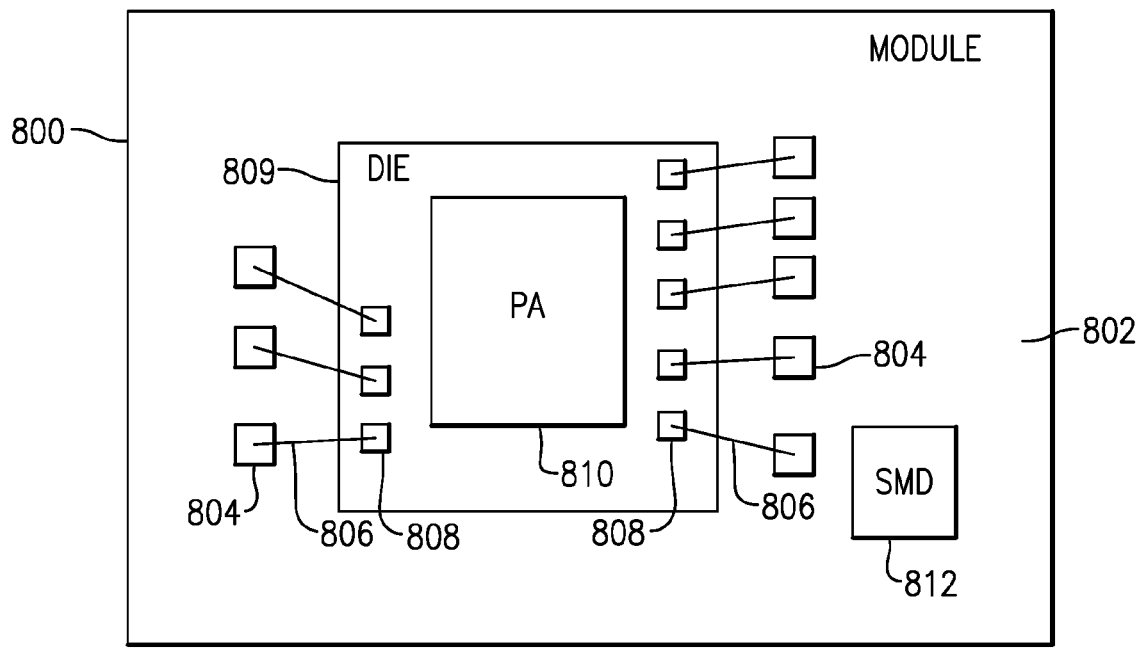
FIGS. 8A and 8B illustrate a die having one or more features as described herein.
Figure 8B:
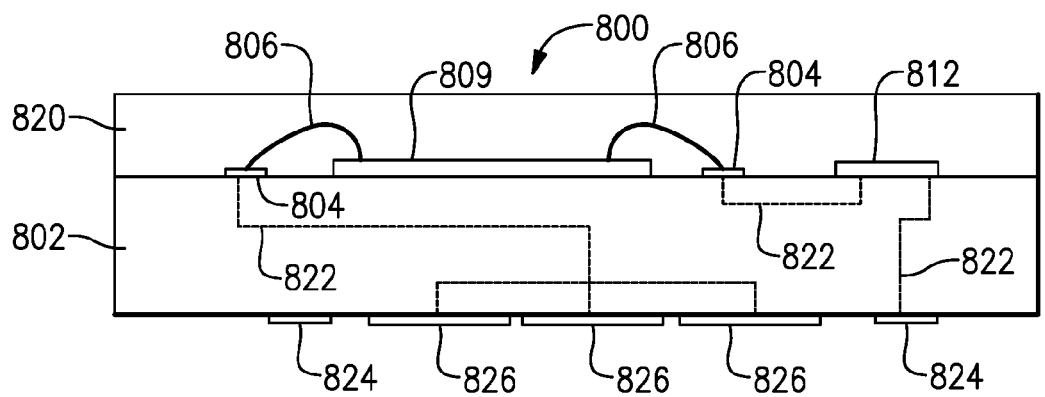

In some embodiments, a die having one or more features as described herein can be implemented in a module such as a packaged module. An example of such a module is shown in FIGS. 8A (plan view) and 8B (side view). A module 800 is shown to include a packaging substrate 802. Such a packaging substrate can be configured to receive a plurality of components, and can include, for example, a laminate substrate. The components mounted on the packaging substrate 802 can include one or more die. In the example shown, a die 809 having a power amplifier (PA) 810 with over-voltage protection as described herein is shown to be mounted on the packaging substrate 802. The die 809 can be electrically connected to other parts of the module through connections such as connection-wirebonds 806. Such connection-wirebonds can be formed between contact pads 808 formed on the die 809 and contact pads 804 formed on the packaging substrate 802. In some embodiments, one or more surface mounted devices (SMDs) 812 can be mounted on the packaging substrate 802 to facilitate various functionalities of the module 800.

In some embodiments, the packaging substrate 802 can include electrical connection paths for interconnecting the various components with each other and/or with contact pads for external connections. For example, a connection path 822 is depicted as interconnecting the SMD 812 with an external-connection contact pad 824. In yet another example, a connection path 822 is depicted as interconnecting the die 809 with ground-connection contact pads 826.

In some embodiments, a space above the packaging substrate 802 and the various components mounted thereon can be filled with an overmold structure 820. Such an overmold structure can provide a number of desirable functionalities, including protection for the components and wirebonds from external elements, and easier handling of the packaged module 800.

Figure 9:
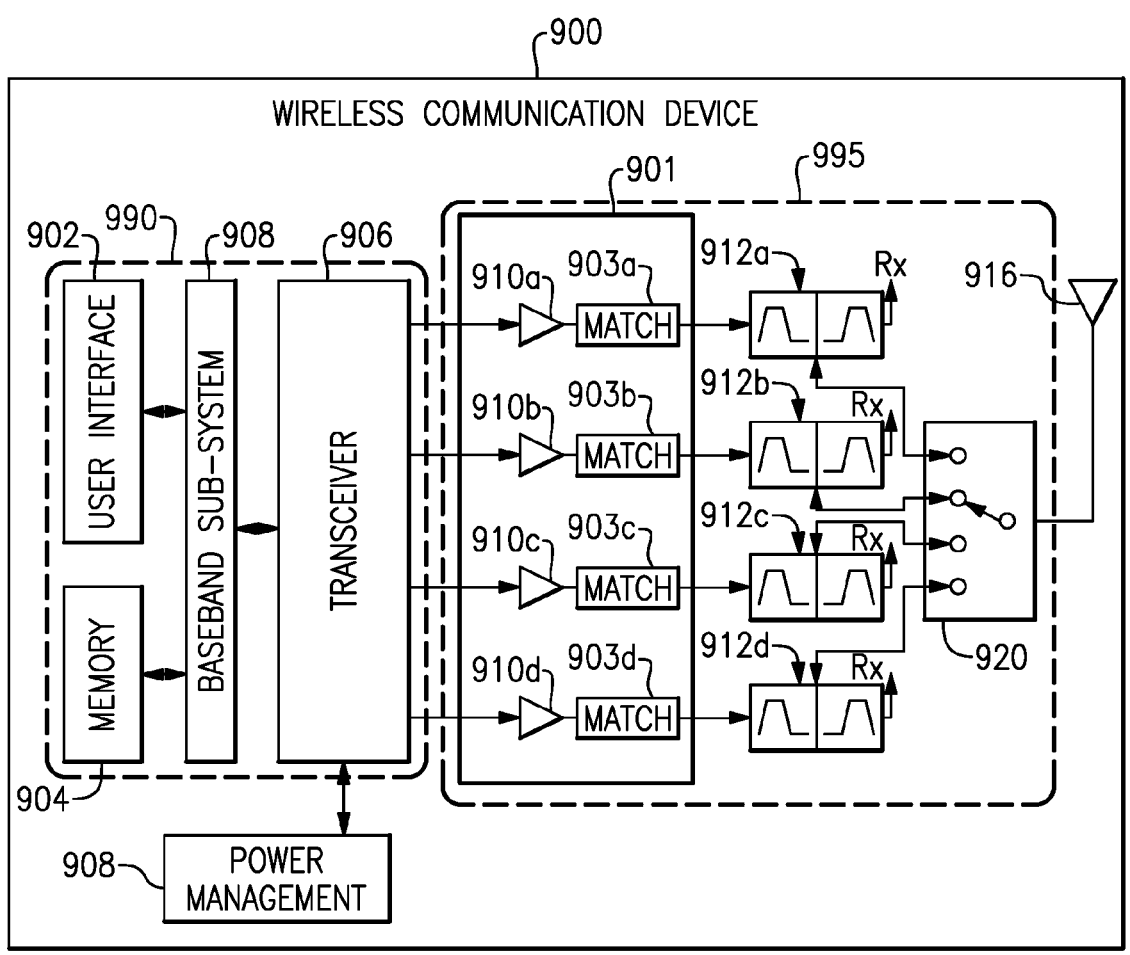
FIG. 9 schematically depicts an example wireless communication device in accordance with one or more embodiments.

FIG. 9 schematically depicts an example wireless communication device 900 having one or more advantageous features described herein. The wireless communication device 900 may include both RF components 995 and baseband components 990. In certain embodiments, the wireless communication device 900 may include one or more power amplifiers 910 having voltage-limiting TSVs associated therewith according to one or more embodiments disclosed herein. In some embodiments, such a power amplifier configuration can provide over-voltage protection.

In the example wireless device 900, a power amplifier (PA) module 901 having a plurality of PAs can provide an amplified RF signal to a switch 920, and the switch 920 can route the amplified RF signal to an antenna 916. The PA module 901 can receive an unamplified RF signal from a transceiver 906 that can be configured and operated in a known manner. The transceiver 906 can also be configured to process received signals. The transceiver 906 is shown to interact with a baseband sub-system 908 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In some embodiments, a duplexer 912 can allow transmit and receive operations to be performed simultaneously using a common antenna (e.g., 916). In FIG. 9, received signals are shown to be routed to "Rx" paths (not shown) that can include, for example, one or more low-noise amplifiers (LNA).

Although certain high-resistivity applications are discussed herein, it should be understood that embodiments of the present disclosure may be applicable in applications utilizing any suitable or desirable semiconductor substrate. Furthermore, the over-voltage protection principles disclosed may be applicable with respect to other types of transistor devices, including field-effect transistors (FET), floating-gate transistors, hyperjunction bipolar transistors (HBT), or other types of transistors or devices.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. Various examples described herein are in the context of silicon-based semiconductor on which various structures can be formed. However, it will be understood that such features can also be implemented on other semiconductor substrates, including possibly compound semiconductor substrates. For example, compound semiconductors such as GaAs, InP, GaN, InGaP, and InGaAs can be utilized as a substrate on which structures having one or more features as described herein are formed. It will also be understood that although various examples herein are described in the context of compound semiconductors, such features may also be implemented on elemental semiconductors. For example, elemental semiconductors such as silicon and/or germanium can be utilized as a substrate on which structures having one or more features as described herein are formed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency device comprising:
    a semiconductor substrate;
    a bipolar transistor having collector, emitter, base and sub-collector regions disposed on the substrate;
    an expitaxial layer of low-resistivity substrate formed at a top surface of the semiconductor substrate;
    a through-silicon via positioned within 35 µm of the sub-collector region in order to clamp a peak voltage of the bipolar transistor at a voltage limit level;
    a low-resistivity well implanted at the top surface of the semiconductor substrate; and
    a high-resistivity implant region implanted at the top surface of the semiconductor substrate between the low-resistivity well and the through-silicon via.

2. The radio-frequency device of claim 1 wherein the through-silicon via is disposed a distance of between approximately 15-25 µm from the sub-collector region of the bipolar transistor.

3. The radio-frequency device of claim 1 wherein the through-silicon via is disposed a distance of approximately 20 µm from the sub-collector region of the bipolar transistor.

4. The radio-frequency device of claim 1 wherein the through-silicon via is disposed a distance of between approximately 10-15 µm from the sub-collector region of the bipolar transistor.

5. The radio-frequency device of claim 1 wherein the voltage limit level is between approximately 4-9 volts.

6. The radio-frequency device of claim 1 wherein the bipolar transistor is a bipolar transistor having a silicon or silicon-germanium alloy base.

7. The radio-frequency device of claim 1 wherein the semiconductor substrate has a resistivity greater than 50 Ohm*cm.

8. The radio-frequency device of claim 1 wherein the semiconductor substrate includes a high-resistivity portion and the bipolar transistor is disposed above the high-resistivity portion.

9. The radio-frequency device of claim 8 wherein the high-resistivity portion has a resistivity value greater than 500 Ohm*cm.

10. The radio-frequency device of claim 8 wherein the high-resistivity portion has a resistivity of at least approximately 1 kOhm*cm.

11. The radio-frequency device of claim 1 wherein the bipolar transistor is a component of a power amplifier.

* * * * *